United States Patent
Chung et al.

(10) Patent No.: US 11,078,565 B2
(45) Date of Patent: *Aug. 3, 2021

(54) THERMAL EVAPORATION PROCESS FOR MANUFACTURE OF SOLID STATE BATTERY DEVICES

(71) Applicant: Sakti3, Inc., Ann Arbor, MI (US)

(72) Inventors: Myoungdo Chung, Ann Arbor, MI (US); HyonCheol Kim, Ann Arbor, MI (US); Ann Marie Sastry, Ann Arbor, MI (US); Marc Langlois, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/495,840

(22) Filed: Apr. 24, 2017

(65) Prior Publication Data
US 2017/0356078 A1 Dec. 14, 2017

Related U.S. Application Data

(63) Continuation of application No. 14/820,500, filed on Aug. 6, 2015, now Pat. No. 9,631,269, which is a
(Continued)

(51) Int. Cl.
*C23C 14/00* (2006.01)
*C23C 14/58* (2006.01)
(Continued)

(52) U.S. Cl.
CPC ...... *C23C 14/0031* (2013.01); *C23C 14/0676* (2013.01); *C23C 14/083* (2013.01);
(Continued)

(58) Field of Classification Search
CPC .. H01M 4/0423; H01M 4/131; H01M 4/1391; H01M 4/382; H01M 4/48;
(Continued)

(56) References Cited

U.S. PATENT DOCUMENTS 2,862,646 A 12/1958 Hayford et al.
4,009,052 A * 2/1977 Whittingham ........ H01M 4/581
429/199
(Continued)

FOREIGN PATENT DOCUMENTS

EP 1593754 11/2005
JP 5-320906 12/1993
(Continued)

OTHER PUBLICATIONS

Aceves et al., "Computer Modeling in the Design and Evaluation of Electric and Hybrid Vehicles" 11th Annual National Educators' Workshop, Los Alamos, New Mexico, Oct. 27-30, 1996; retrieved from the Internet: <<http://www.osti.gov/bridge/servlets/purl/381678-Unwv9F/webviewabl-e/381678.pdf>>, 12 pages.
(Continued)

*Primary Examiner* — Michael P Wieczorek
(74) *Attorney, Agent, or Firm* — Morrison & Foerster LLP

(57) ABSTRACT

A method for manufacturing a solid-state battery device. The method can include providing a substrate within a process region of an apparatus. A cathode source and an anode source can be subjected to one or more energy sources to transfer thermal energy into a portion of the source materials to evaporate into a vapor phase. An ionic species from an ion source can be introduced and a thickness of solid-state battery materials can be formed overlying the surface region by interacting the gaseous species derived from the plurality of electrons and the ionic species. During formation of the thickness of the solid-state battery materials, the surface region can be maintained in a vacuum environment from about $10^{-6}$ to $10^{-4}$ Torr. Active materials comprising cathode, electrolyte, and anode with non-reactive species can be
(Continued)

deposited for the formation of modified modulus layers, such a void or voided porous like materials.

15 Claims, 9 Drawing Sheets

Related U.S. Application Data continuation of application No. 13/291,845, filed on Nov. 8, 2011, now Pat. No. 9,127,344.

(51) Int. Cl.

| | | |
|---|---|---|
| *C23C 14/06* | (2006.01) | |
| *C23C 14/08* | (2006.01) | |
| *H01M 4/131* | (2010.01) | |
| *H01M 4/1391* | (2010.01) | |
| *H01M 4/04* | (2006.01) | |
| *H01M 4/38* | (2006.01) | |
| *H01M 4/48* | (2010.01) | |
| *H01M 4/58* | (2010.01) | |
| *H01M 6/40* | (2006.01) | |
| *H01M 10/0562* | (2010.01) | |
| *H01M 10/0585* | (2010.01) | |
| *H01M 50/403* | (2021.01) | |
| *H01M 4/02* | (2006.01) | |

(52) U.S. Cl.
CPC ....... *C23C 14/5833* (2013.01); *H01M 4/0423* (2013.01); *H01M 4/131* (2013.01); *H01M 4/1391* (2013.01); *H01M 4/382* (2013.01); *H01M 4/48* (2013.01); *H01M 4/483* (2013.01); *H01M 4/5825* (2013.01); *H01M 6/40* (2013.01); *H01M 10/0562* (2013.01); *H01M 10/0585* (2013.01); *H01M 50/403* (2021.01); *H01M 2004/028* (2013.01)

(58) Field of Classification Search
CPC .... H01M 4/483; H01M 4/5825; H01M 2/145; H01M 6/40; H01M 10/0562; H01M 10/0585; H01M 2004/028; C23C 14/0031; C23C 14/0676; C23C 14/083; C23C 14/5833
See application file for complete search history.

(56) References Cited

U.S. PATENT DOCUMENTS

| | | | |
|---|---|---|---|
| 4,648,347 A * | 3/1987 | Aichert | C23C 14/562 |
| | | | 118/504 |
| 4,854,264 A * | 8/1989 | Noma | C23C 14/56 |
| | | | 118/719 |
| 4,933,889 A | 6/1990 | Meshkat et al. | |
| 5,107,791 A * | 4/1992 | Hirokawa | C23C 14/10 |
| | | | 118/719 |
| 5,338,625 A | 8/1994 | Bates et al. | |
| 5,367,465 A | 11/1994 | Tazawa et al. | |
| 5,377,118 A | 12/1994 | Leon et al. | |
| 5,402,366 A | 3/1995 | Kihara et al. | |
| 5,411,592 A | 5/1995 | Ovshinsky et al. | |
| 5,453,934 A | 9/1995 | Taghavi et al. | |
| 5,498,489 A | 3/1996 | Dasgupta et al. | |
| 5,571,749 A | 11/1996 | Matsuda et al. | |
| 5,751,591 A | 5/1998 | Asada | |
| 5,906,757 A | 5/1999 | Kong et al. | |
| 6,016,047 A | 1/2000 | Notten et al. | |
| 6,294,479 B1 | 9/2001 | Ebe et al. | |
| 6,350,222 B2 | 2/2002 | Sunsnjara | |
| 6,402,443 B1 | 6/2002 | Hoppe | |
| 6,656,234 B2 | 12/2003 | Dexter et al. | |
| 6,833,031 B2 | 12/2004 | Arnold | |
| 6,884,333 B2 | 4/2005 | Landau | |
| 6,924,164 B2 | 8/2005 | Jenson | |
| 6,962,823 B2 | 11/2005 | Empedocles et al. | |
| 6,982,132 B1 | 1/2006 | Goldner et al. | |
| 7,107,193 B1 | 9/2006 | Hummel et al. | |
| 7,194,801 B2 * | 3/2007 | Jenson | A61N 1/3787 |
| | | | 117/902 |
| 7,294,209 B2 | 11/2007 | Shakespeare | |
| 7,315,789 B2 | 1/2008 | Plett | |
| 7,361,327 B2 | 4/2008 | Tumas et al. | |
| 7,490,710 B1 | 2/2009 | Weskamp et al. | |
| 7,553,584 B2 | 6/2009 | Chiang et al. | |
| 7,579,112 B2 | 8/2009 | Chiang et al. | |
| 7,618,742 B2 | 11/2009 | Kaplin et al. | |
| 7,625,198 B2 | 12/2009 | Lipson et al. | |
| 7,945,344 B2 | 5/2011 | Wang et al. | |
| 8,168,326 B2 | 5/2012 | Chiang et al. | |
| 9,127,344 B2 * | 9/2015 | Chung | C23C 14/0031 |
| 9,631,269 B2 * | 4/2017 | Chung | C23C 14/0031 |
| 2002/0120906 A1 | 8/2002 | Xia et al. | |
| 2002/0169620 A1 | 11/2002 | Spotnitz et al. | |
| 2003/0064292 A1 | 4/2003 | Neudecker et al. | |
| 2003/0068559 A1 | 4/2003 | Armstrong et al. | |
| 2003/0082446 A1 | 5/2003 | Chiang et al. | |
| 2003/0099884 A1 | 5/2003 | Chiang et al. | |
| 2003/0108800 A1 | 6/2003 | Barbarich | |
| 2004/0131761 A1 | 7/2004 | Shakespeare | |
| 2004/0131925 A1 | 7/2004 | Jenson et al. | |
| 2004/0131937 A1 | 7/2004 | Chen et al. | |
| 2004/0144321 A1 | 7/2004 | Grace et al. | |
| 2004/0151985 A1 | 8/2004 | Munshi | |
| 2004/0185667 A1 | 9/2004 | Jenson | |
| 2004/0258851 A1 | 12/2004 | Selvamanickam et al. | |
| 2005/0079418 A1 | 4/2005 | Kelley et al. | |
| 2005/0114105 A1 | 5/2005 | Barber | |
| 2005/0244580 A1 | 11/2005 | Cok et al. | |
| 2006/0156978 A1 | 7/2006 | Lipson et al. | |
| 2006/0138350 A1 | 9/2006 | Banine et al. | |
| 2007/0110892 A1 * | 5/2007 | Awata | C23C 14/16 |
| | | | 427/8 |
| 2007/0186852 A1 | 8/2007 | Sakata et al. | |
| 2007/0218329 A1 | 9/2007 | Keith et al. | |
| 2008/0118782 A1 | 5/2008 | Heller et al. | |
| 2008/0187832 A1 * | 8/2008 | Takezawa | H01M 4/04 |
| | | | 429/209 |
| 2008/0259976 A1 | 10/2008 | Hrudey et al. | |
| 2009/0061090 A1 | 3/2009 | Negishi | |
| 2009/0157369 A1 | 6/2009 | Li et al. | |
| 2009/0217876 A1 | 9/2009 | Epstein | |
| 2009/0304906 A1 | 12/2009 | Suduo et al. | |
| 2009/0325063 A1 | 12/2009 | Albano et al. | |
| 2009/0326696 A1 | 12/2009 | Wang et al. | |
| 2010/0015361 A1 | 1/2010 | Negishi | |
| 2010/0035152 A1 | 2/2010 | Sastry et al. | |
| 2010/0082142 A1 | 4/2010 | Usadi et al. | |
| 2010/0190051 A1 | 7/2010 | Aitken et al. | |
| 2011/0165326 A1 | 7/2011 | Little et al. | |
| 2011/0202159 A1 | 8/2011 | Wang et al. | |
| 2011/0217578 A1 | 9/2011 | Albano et al. | |
| 2011/0301931 A1 | 12/2011 | Gering | |
| 2011/0318498 A1 | 12/2011 | Wadley et al. | |
| 2012/0040233 A1 | 2/2012 | Kim et al. | |
| 2012/0049126 A1 * | 3/2012 | Park | H01M 4/5825 |
| | | | 252/506 |
| 2012/0058280 A1 | 3/2012 | Chung et al. | |

FOREIGN PATENT DOCUMENTS

| | | |
|---|---|---|
| JP | 6-116722 | 4/1994 |
| JP | 2004-319449 | 11/2004 |
| JP | 2005-93373 | 4/2005 |
| JP | 2005-353759 | 12/2005 |

OTHER PUBLICATIONS

Ceder et al., (2002) Computational Modeling and Simulation for Rechargable Batteries, MRS Bulletin, 5 pages . . . .

(56) References Cited

OTHER PUBLICATIONS

Chen et al., (2007) "Selection of Conductive Additives in Li-ion Battery Cathodes: A Numerical Study", Journal of Electrochemical Society, 154(10): A978-A986.
Doyle et al., (2003) "Computer Simulations of Li-Ion Polymer Battery and Implications for Higher Capacity Next-Generation Battery Designs", Journal of Electrochemical Soeciety, 8 pages.
Wang et al., (2007) "Mesoscale Modeling of Li-Ion Polymer Cell," Journal of the Electrochemical Society, 154(11):A1035-A1047.
International Search Report and Written Opinion dated Aug. 24, 2009, directed to International Application No. PCT/US2009/047848; 9 pages.
International Search Report and Written Opinion dated Aug. 24, 2009, directed to International Application No. PCT/US2009/047846; 11 pages.
Notice of Reasons for Rejection dated Jan. 28, 2014, directed to JP Application No. 2011-514817; 9 pages.
Wang et al., U.S. Office Action dated Aug. 2, 2012, directed to U.S. Appl. No. 13/292,663; 12 pages.
Wang et al., U.S. Office Action dated Oct. 17, 2012, directed to U.S. Appl. No. 13/086,825; 18 pages.
Wang et al., U.S. Office Action dated Apr. 26, 2013, directed to U.S. Appl. No. 13/086,825; 17 pages.
Kim et al., U.S. Office Action dated Oct. 1, 2013, directed to U.S. Appl. No. 13/415,774; 16 pages.
Extended European Search Report dated Oct. 11, 2012, directed to EP Application No. 09767761.1; 6 pages.
Extended European Search Report dated Jun. 14, 2013, directed to EP Application No. 09767760.3; 13 pages.
Zeng et al. (Feb. 2008) "Multiscale modeling and simulation of polymer nanocomposites", *Progress in Polymer Science*, 33(2), 191-269.
Albano et al., U.S. Office Action dated Jan. 9, 2013, directed to U.S. Appl. No. 13/103,008; 7 pages.
Wang et al., U.S. Office Action dated Feb. 27, 2013, directed to U.S. Appl. No. 13/292,663; 11 pages.
Albano et al., U.S. Advisory Action dated Mar. 15, 2013, directed to U.S. Appl. No. 14/103,004; 3 pages.
Sastry et al., U.S. Notice of Allowance dated Mar. 15, 2013, directed to U.S. Appl. No. 13/648,429; 8 pages.
Sastry et al., U.S. Notice of Allowance dated Aug. 16, 2013, directed to U.S. Appl. No. 13/911,015; 9 pages.
Chung et al., U.S. Office Action dated Apr. 9, 2012, directed to U.S. Appl. No. 13/291,845; 20 pages.
Chung et al., U.S. Office Action dated Nov. 26, 2012, directed to U.S. Appl. No. 13/291,845; 20 pages.
Chung et al., U.S. Office Action dated Apr. 7, 2014, directed to U.S. Appl. No. 13/291,845; 18 pages.
Chung et al., U.S. Office Action dated Oct. 6, 2014, directed to U.S. Appl. No. 13/291,845; 17 pages.
Chung et al., U.S. Office Action dated Jun. 22, 2016, directed to U.S. Appl. No. 14/820,500; 9 pages.

\* cited by examiner

THERMAL EVAPORATION PROCESS FOR MANUFACTURE OF SOLID STATE BATTERY DEVICES

REFERENCE TO RELATED APPLICATIONS

This application is a continuation of U.S. patent application Ser. No. 14/820,500, filed Aug. 6, 2015, now U.S. Pat. No. 9,631,269, which is a continuation of U.S. patent application Ser. No. 13/291,845, filed Nov. 8, 2011, now U.S. Pat. No. 9,127,344, the entire contents of which are incorporated herein by reference.

BACKGROUND OF THE INVENTION

This present invention relates to manufacture of electrochemical cells. More particularly, the present invention provides a method and resulting device for forming elements of a thin film solid-state electrochemical cell. Merely by way of example, the invention has been provided with use of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

The intercalation of a variety of electron donors, including Li-ions, into amorphous or crystalline materials, such as transition metal compounds and graphite has been widely studied and used as a principal mechanism of rechargeable batteries. When a Li-ion cell is charged, the positive material is oxidized and the negative material is reduced. In this process, Li-ions are de-intercalated from the positive material and intercalated into the negative material. The reverse happens on discharge. Of particular interest to the field of Li-ion batteries recently is the work on developing intercalation compound as cathode materials. However, these amorphous or crystalline intercalation compounds often have insufficient ionic/electronic conductivity to be used in battery electrodes alone.

Conventional method of improving electrode conductivity is mixing or coating the active materials (i.e. intercalation compounds) with conductive additives, such as a microbead mesophase carbon, artificial graphite or milled graphite fiber. Most Li-ion batteries are produced this way today. The use of composite electrodes has been one of the key problems to Li-ion battery researchers as it is linked to battery failure mechanisms. The inhomogeneous mixture in the electrode caused non-uniform charge distribution and localized stress and heat generation, often leads to the limited cycle life of batteries. Furthermore, addition of binder and conductive materials reduce energy density of the battery.

An alternative method of enhancing conductivity in amorphous and crystalline intercalation compound is changing the material's own composition by doping or substituting with other elements. Changing the doping is to improve the functional electrical properties of electron transport and electric or ion to improve the structural stability of materials. This doping method can be readily done with physical vapor deposition (PVD) for solid-state battery manufacturing using additional ion source to the deposition processes.

Solid-state electrolytes for Li-ion batteries including Li-ion conducting glassy materials, best represented by LiPON (Lithium Phosphorous Oxynitride), have been fabricated by physical vapor deposition techniques. LiPON films are typically deposited by sputtering technique using lithium phosphate target in nitrogen plasma, resulting enhanced ionic mobility and good ionic conductivity at $10^{-6}$-$10^{-7}$ S/cm due to the formation of additional phosphate cross-linking by nitrogen ions. However, the deposition rate from sputtered LiPON is limited to only 1-2 Å/s. Other techniques using higher energy sources, such as electron beam evaporation attempt to achieve higher deposition rate, but their yields to obtain defect-free thin films are low. The key challenge to the high volume production of thin film batteries and the solid-state electrolyte is achieving a high deposition rate and preventing the defect formation caused by the higher energy transfer during the processing.

Prior art with conventional battery materials manufacturing has been mostly limited to the particulate materials, and its synthesis method by chemical routes involving high temperature processes, which is not suitable for roll-to-roll solid-state battery manufacturing. Prior art with solid-state thin film materials has been limited to a small number of deposition techniques and enhancement of cathode and electrolyte conductivity has been challenging issue, as well as faster process rate and higher production yield. For roll-to-roll processes using polymer substrate, lower temperature PVD process is desired for enhancing materials ionic/electronic conductivity. Furthermore, PVD process that we describe in this patent has advantages over the chemical doping methods, in terms of tunability, processibility, and cost.

Accordingly, it is seen that there exists a need for a method and materials to produce an improved package of a large scale, high capacity solid-state battery.

BRIEF SUMMARY OF THE INVENTION

According to the present invention, techniques related to manufacture of electrochemical cells are provided. More particularly, the present invention provides a method and resulting device for forming elements of a thin film solid-state electrochemical cell. Merely by way of example, the invention has been provided with use of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

In a specific embodiment, the present invention provides a method for manufacturing a cathode device for a solid-state battery device using a flash process. As used herein, the term "flash process" means a film deposition process delivering the metered stream of evaporant to the hot wall of the reactor in a pattern whereas the balance between mass delivered and mass evaporated is constant, without causing residence times which would degrade the evaporant or coat the reactor surface. The method includes providing a substrate including a surface region, which is configured on a transfer device, e.g., roll to roll, drum, or others. The method includes subjecting a cathode source comprising a metal oxide species to thermal energy to cause a portion of the cathode source to evaporate into a vapor phase within a time period of less than about one second to substantially evaporate the portion of the cathode source free from formation of undesirable metal oxide species. The method also includes forming a thickness of metal oxide material overlying the surface region by condensing the gaseous species as the substrate moves either in a first direction or a second direction; subjecting the thickness of the metal oxide material to an ion source comprising an oxygen species, an argon species, and a nitrogen species while the thickness of metal oxide material is being formed and/or after the thickness of metal oxide material has been formed. The method includes maintaining the surface region in a vacuum environment from about $10^{-6}$ to $10^{-4}$ Torr during the formation of the thickness of the metal oxide material.

In a specific embodiment, the forming of the thickness cathode material occurs at a rate of about 100 to 10,000 Angstroms per second per 100 square centimeters; wherein the ion source is an ion beam or an ion shower. The substrate moves at a rate of about 1 inches/min to about 10 feet/min. In a specific embodiment, the cathode source comprises a vanadium oxide having a purity. The ion beam causes an electrical conductivity of the thickness of the metal oxide material to increase from about $10^{-8}$ Siemens/meter to about $10^{-5}$ Siemens/meter and causes an increase of an atomic nitrogen content of the thickness of the metal oxide material from about 0.5% to about 7% in a specific embodiment. In a specific embodiment, the metal oxide is selected from one of a vanadium oxide, a manganese oxide, an iron oxide, nickel oxide, sulfur oxide, cobalt oxide, or magnesium oxide, combinations, and others. The method also further comprising introducing a dopant species into the thickness of metal oxide using an ion beam process to cause an increase in conductivity of the thickness of metal oxide material and cause an increase in ionic diffusivity of the thickness of the metal oxide material. Additionally, the method also may comprise introducing a dopant species into the thickness of metal oxide in a specific embodiment, the dopant is selected from at least nitrogen, oxygen, carbon, fluorine, silver, molybdenum, copper, tin, aluminum, iodine, phosphorous, and silicon. As used herein, the term "dopant" means a trace impurity element that is inserted into a substance in order to alter the properties of the substance, but can have other meanings consistent with one of ordinary skill in the art. The method also includes subjecting the energy to the cathode source is provided on a hot wall reactor region, which is characterized by a temperature ranging from about 600 to 1200 Degrees Centigrade. The metal oxide is vanadium oxide and the ion beam is provided at an energy from about 100 to about 400 electron volts. In a specific embodiment, the transfer device comprises a first drum coupled to a second drum and configured in a reel to reel. The transfer device is configured for single or multiple pass of the substrate. Preferably, the cathode source is one of a plurality of sources.

In an alternative specific embodiment, the present invention provides a method for manufacturing a solid-state battery device. The method includes providing a substrate including a surface region, the substrate being provided within a process region of an apparatus. The method also includes subjecting a electrolyte source comprising an oxide and a phosphide or a phosphate or a sulfate or borate to one or more energy sources to transfer thermal energy into a portion of the electrolyte source to evaporate into a vapor phase. The method includes introducing an ionic species from an ion source and forming a thickness of electrolyte material overlying the surface region by interacting the gaseous species derived from the plurality of electrons and the ionic species. The method also maintains the surface region in a vacuum environment from about $10^{-6}$ to $10^{-4}$ Torr during formation of the thickness of the electrolyte material.

In a specific embodiment, the forming of the thickness of the electrolyte material occurs at a rate of about 100 to 10,000 Angstroms per second per 100 square centimeters. The one or more energy sources are selected from an electron source or a hot wall reactor. The ion source is at least an ion beam or an ion shower. In a specific embodiment, the substrate moves at a rate of about 1 inches/min to about 10 feet/min. The substrate temperature ranges from about 5 Degrees Centigrade to about 50 Degrees Centigrade. The electrolyte source comprises lithium phosphate Li3PO4 having a purity, e.g., 99%. The introducing of the ionic species is provided during formation of the thickness of the electrolyte material and/or after the formation of the thickness of the electrolyte material. The substrate is a web structure or a drum device. The phosphide comprises a lithium species or a manganese species and the phosphate comprises an iron species or a lithium species. The method also further comprising subjecting the substrate to a predetermined temperature ranging from about 5 Degrees Centigrade to about 50 Degrees Centigrade. The substrate is configured for single or multiple pass of the substrate. The electrolyte source is one of a plurality of sources. The formation of the electrolyte material comprises forming a first thickness of about 50 to about 2000 Angstroms at a rate of less than about 1-10 Angstroms per second and an overlying second thickness of about 1000 to about 10,000 Angstroms at a rate greater than about 10 Angstroms per second to cause formation of a substantially spit-free material. Of course, there can be other variations, modifications, and alternatives.

In an alternative specific embodiment, the present invention provides a method for manufacturing a solid-state battery device. The method includes providing a substrate including a surface region configured on a transfer device. The method also includes subjecting an anode source comprising a lithium species to a thermal sources to cause the lithium source material to evaporate into a vapor phase and forming a thickness of lithium metal or alloy overlying the surface region by condensing the gaseous lithium derived from thermal source as the substrate moves either in the first direction or the second direction in a specific embodiment. The method includes maintaining the surface region in a vacuum environment from about $10^{-6}$ to $10^{-4}$ Torr and maintaining the surface region of the substrate to a temperature ranging from −30 to 100 Degrees Celsius to facilitate formation of the thickness of lithium metal or alloy.

In a specific embodiment, the forming of the thickness occurs at a rate of about 100 to 10,000 Angstroms per second per 100 square centimeters. The substrate moves at a rate of about 10 inches/min to about 10 feet/min in a specific embodiment. In a specific embodiment, the anode source comprises a lithium metal alloy having a purity. The thermal source is provided by a hot wall reactor or an electron beam. In a specific embodiment, the thermal source provides a temperature ranging from about 200 to 600 Degrees Celsius. The transfer device comprises a first drum coupled to a second drum and configured in a reel to reel. The transfer device is configured for single or multiple pass of the substrate. The anode source is one of a plurality of sources. Of course, there can be other variations, modifications, and alternatives.

Embodiments of the present invention relate to methods for manufacturing solid-state electrochemical cells in roll-to-roll processes. One embodiment of the present invention comprises a physical vapor deposition process designed to fabricate cathode materials with ion beam assisted deposition for enhancement of its electronic conductivity by doping nitrogen, oxygen, or metal species. In one embodiment, the solid-state electrolyte for roll-to-roll manufacturing is fabricated by bi-layer process wherein the formation of the electrolyte material comprises depositing a first thin film at a relatively slow rate and an overlying second thickness at a faster rate to make the overall rate sufficient for high volume production. The first slow rate process for the first underlying film causes formation of a substantially defect free material. Another embodiment employs high volume production method for solid-state battery anode materials, forming a thickness of lithium metal or alloy by transferring the source to thermal source in a roll-to-roll production chamber. The vacuum chamber is equipped with different sources of energy, including thermal heating, electron beam, and ion beam sources to allow the deposition of the different layers of the electrochemical cells.

Benefits are achieved over conventional techniques. In one or more embodiments, the present method and device uses conventional techniques, which are easy to implement in an efficient and cost effective manner. Additionally, the present method provides for a scalable process for high throughput cell manufacturing. The use of ion beam for tuning the layer properties does not affect the high rate deposition from the flash process that provides an ideal solution for continuous roll-to-roll process. Accordingly, we have been able to systematically produce a cost effective design and manufacturing process to meet performance targets such as performance, reliability, safety, lifecycle, reclamation and reuse, cost, and other factors. Depending upon the specific embodiment, one or more of these benefits may be achieved. Of course, there can be other variations, modifications, and alternatives.

Another advantage of the process in the present invention is the ability to couple multiple evaporation sources, like hot wall reactors, with a single storage-metering-delivery unit; thus allowing longer pre-loaded volumes of evaporant materials. Conversely it is possible with this invention to couple different storage units to a single evaporation source thus allowing multiple layers of different materials to be deposited from a single location which has beneficial attributes of equipment size, capital cost, and substantial technical benefit for masking or delineating layers into electrochemical devices—in particular modulus adjusted layers such as voided or porous materials.

Yet another novel element of the invention is the ability to utilize two or more disparate or individually configured apparatuses to multi-deposit significantly different materials which are not compatible with co deposition from a single unit. Examples in electrochemical devices such as batteries include the multi deposition of cathode and anode chemistries. These chemistries include, but are not limited to layers of vanadium, cobalt, nickel, iron, aluminum, magnesium, lithium, lithium alloys, silicon-lithium compounds, prosperous, phosphates, phosphides, lithiates, sulphides, sulphates, and the like.

Yet a further novel element of the invention is the ability to entrain or co or multi deposit inert materials along with active materials to manufacture unique combination materials possessing useful properties. Examples for the manufacture of electrochemical devices such as batteries include, but are not limited to, the inclusion of nano or micro sized particles of ceramics, glasses, plastics, and the like in order to modify not only the modulus or physical and mechanical properties of the deposited film, but allow a fundamental change in their structure, such as selective removal, after deposition, of one or more of these inert compounds by chemical, thermal, or plasma etching means. One example for the manufacture of electrochemical devices such as batteries is the manufacture of a micro or macro porous film or "anode region" to allow the accumulation of anode materials, such as lithium, under charged or charging states of charge (SOC) by providing a multitude of voids while retaining mechanical stability and electrical conductivity.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to the present invention, processing techniques related to manufacture of solid-state electrochemical cells are provided. More particularly, the present invention provides methods for manufacture of electrodes (cathode and anode) and electrolyte materials by flash evaporation processes for continuous roll-to-roll production, and ion-beam assisted processes for adjusting the required layer properties.

Merely by way of example, the invention has been provided with a vacuum system configured for a multiple pass roll-to-roll coater, in which a substrate is coated with a sequence of steps by changing in direction of the movement of the substrate within a single vacuum chamber. In an alternative approach, the substrate may be moved in the same direction around the reels as a single pass deposition process, with conditions within the chamber periodically changed to result in the continuous build-up of deposited material over time. Alternatives can also be provided where steps are added, one or more steps are removed, or one or more steps are provided in a different sequence without departing from the scope of the claims herein. Further details of the present method can be found throughout the present specification.

Figure 1:
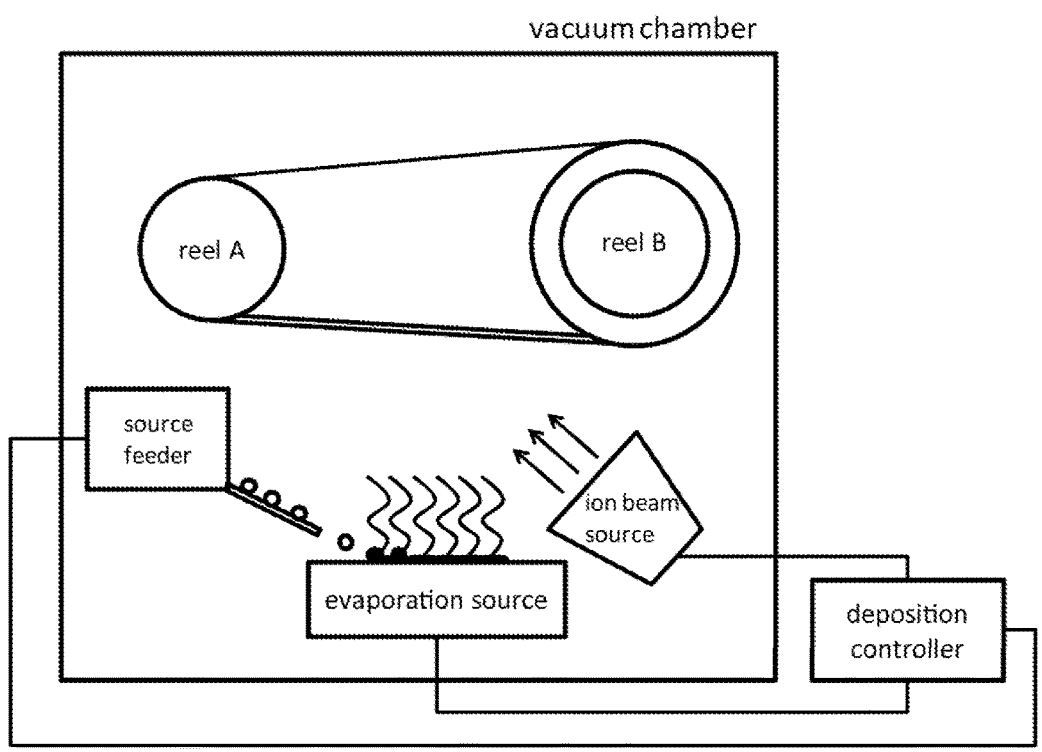
FIG. 1 is a simplified diagram illustrating a flash process for depositing a film of material for an electrochemical cell according to an embodiment of the present invention.
Figure 2A:
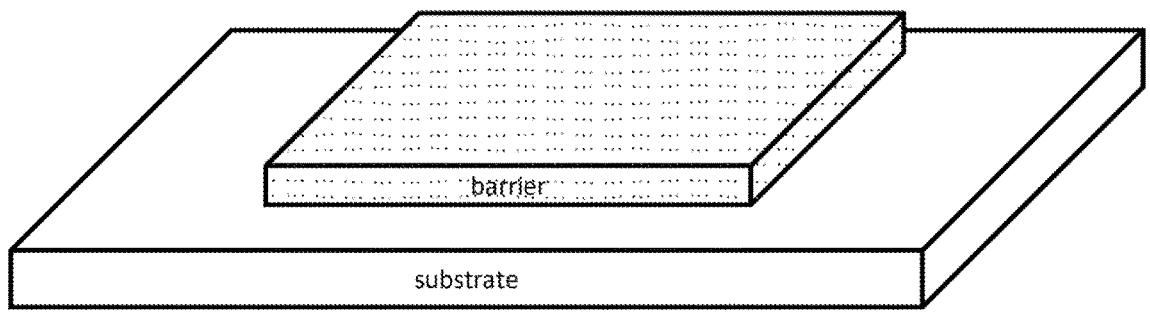
FIGS. 2A-2H are simplified diagrams illustrating a method of fabricating an electrochemical cell according to an embodiment of the present invention.
Figure 2B:
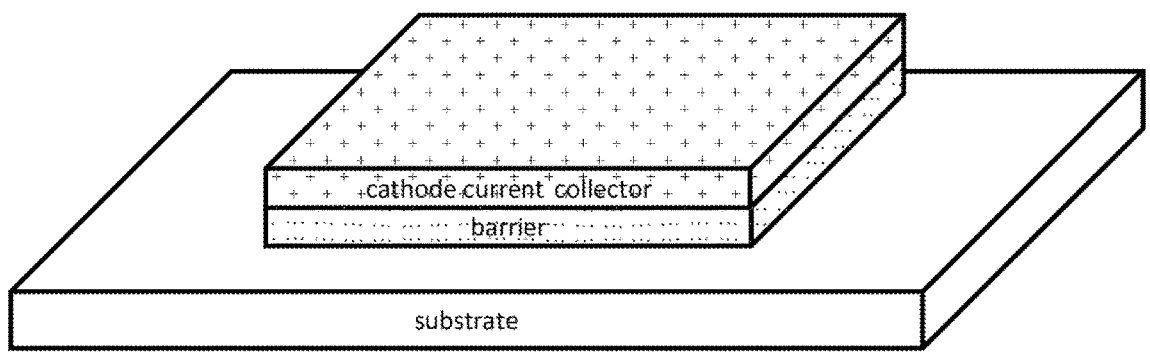
Figure 2C:
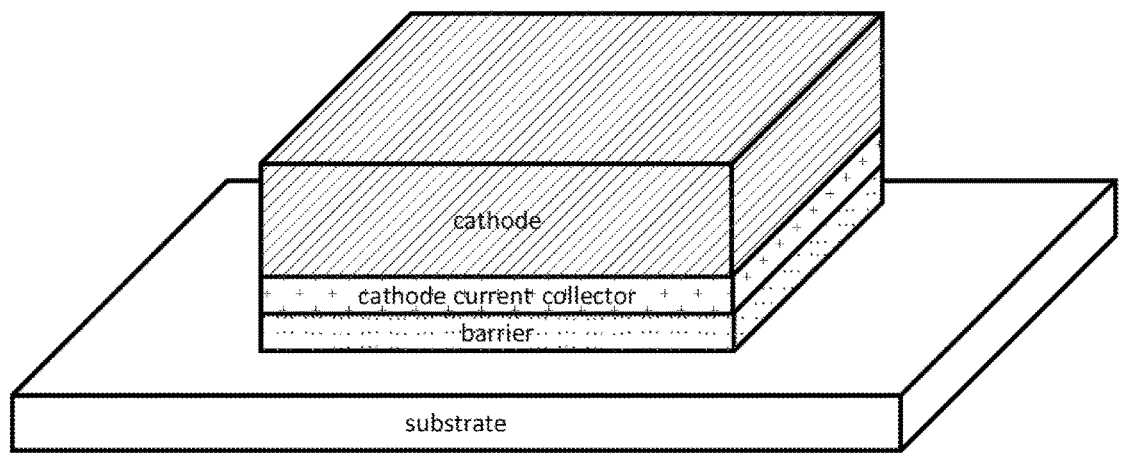
Figure 2D:
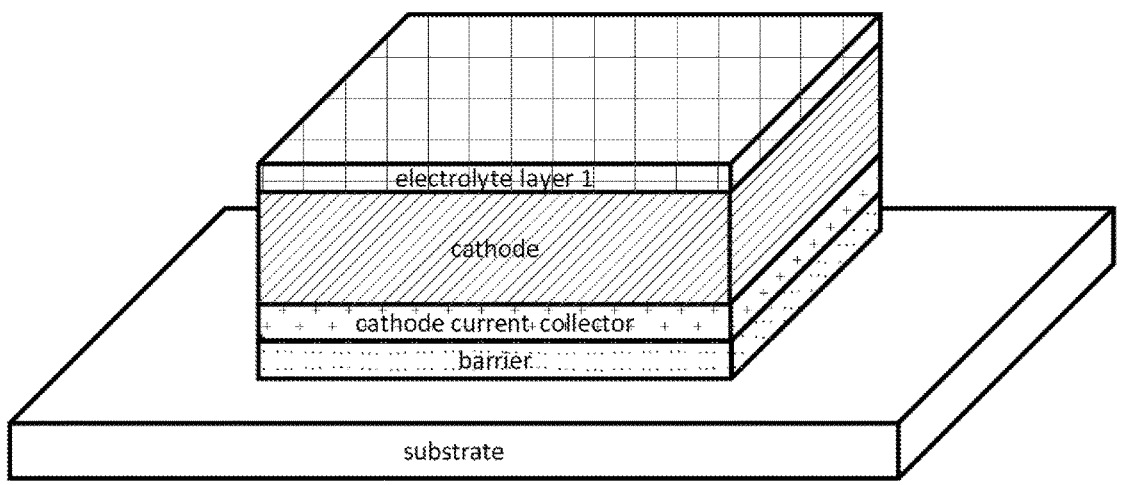
Figure 2E:
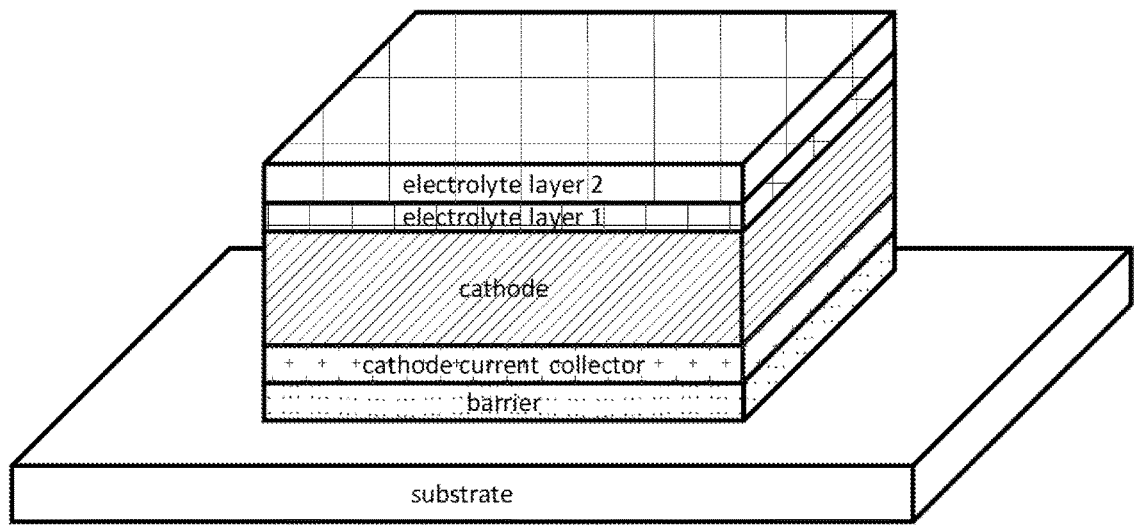
Figure 2F:
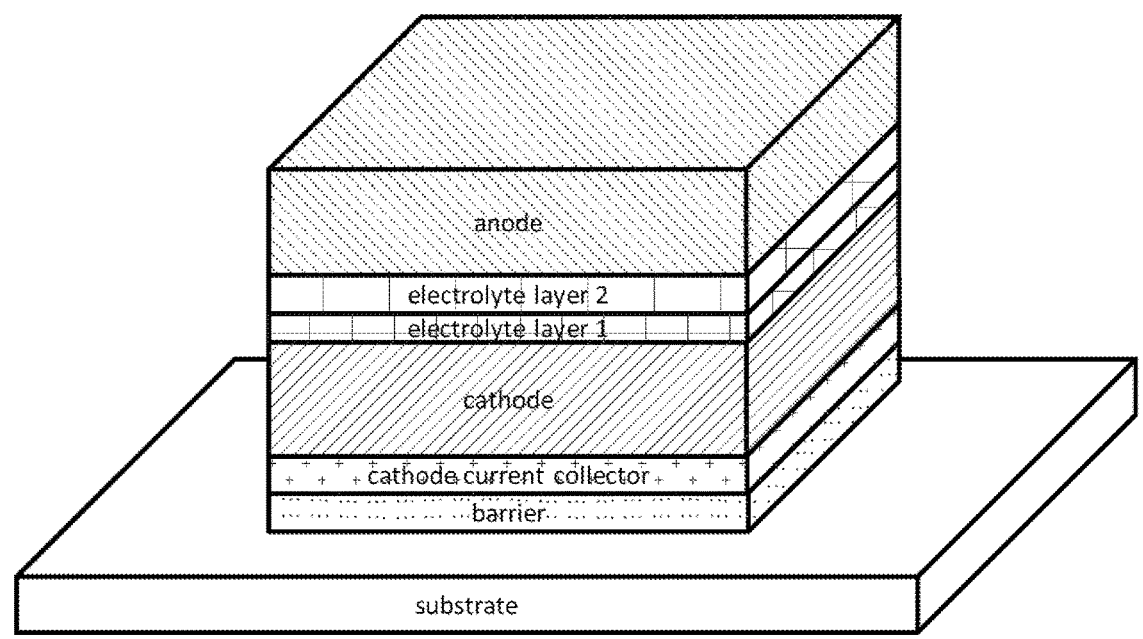
Figure 2G:
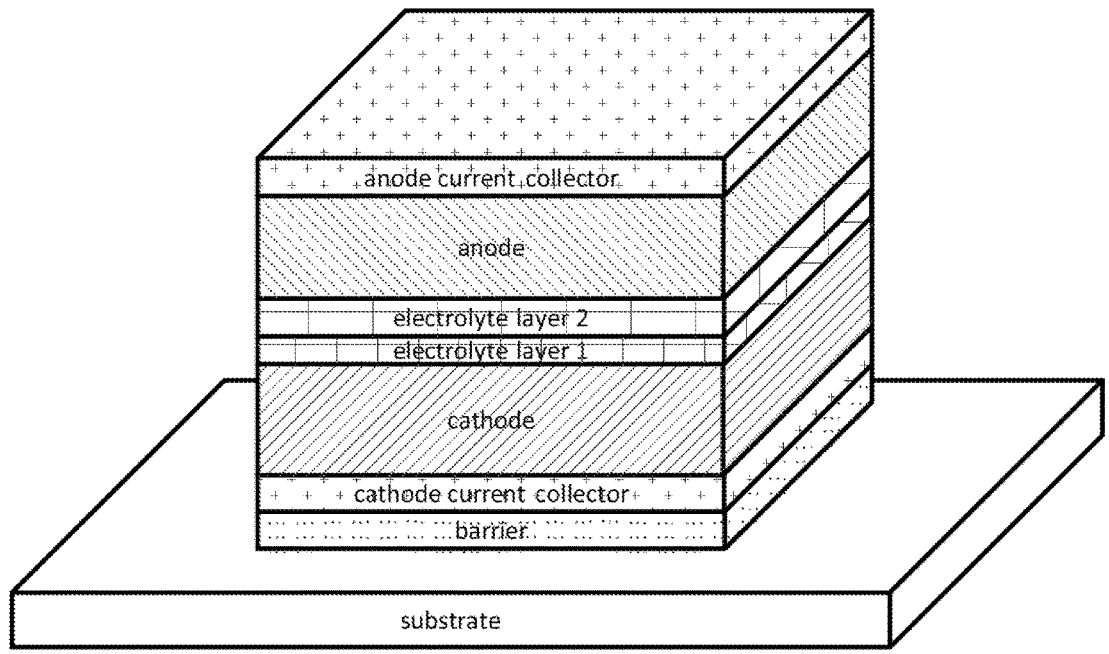
Figure 2H:
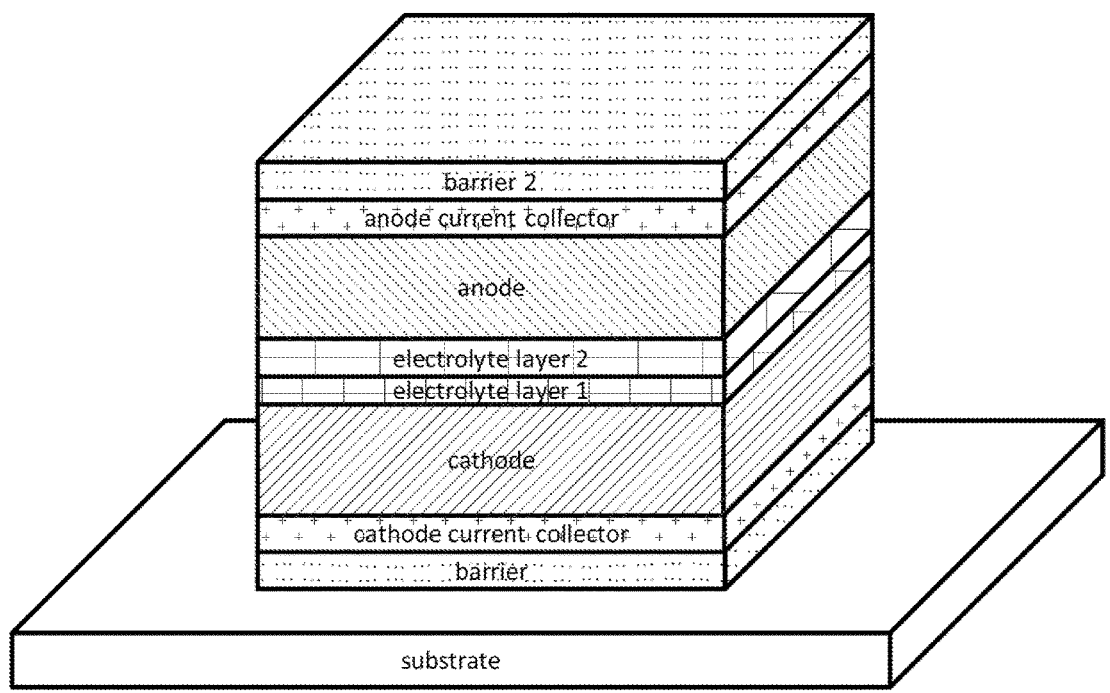

FIG. 1 illustrates a schematic diagram of a flash process for depositing battery material onto a moving substrate in roll-to-roll configuration where the substrate moves from a reel to another reel according to an embodiment of the present invention.

In particular, the flash deposition process of FIG. 1 comprises an evaporation source and an ion beam source to deposit thin film materials making up an electrochemical cell. The evaporation source is a hot wall reactor or an electron beam. The ion beam source is an ion beam or an ion shower. A source material is loaded in the source feeder and fed continuously onto a hot evaporation source to evaporate on contact during the process. In a specific embodiment, the evaporation occurs at a temperature of about 200 to about 1200° C., but can be others. The ion source provides reactive species to the substrate surface for ion beam assisted deposition. Of course, there can be other variations, modifications, and alternatives.

FIG. 2A-2H illustrate simplified cross-sectional views of each process step showing an electrochemical cell layer formed according to an embodiment of the present invention. The process of each layer will follow the process flow steps by FIG. 4 and described later in this section. As shown, the process includes deposition of one or more of the following layers: a barrier, a cathode current collector, a cathode, an electrolyte, an anode, an anode current collector, and an interlayer barrier.

Figure 3:
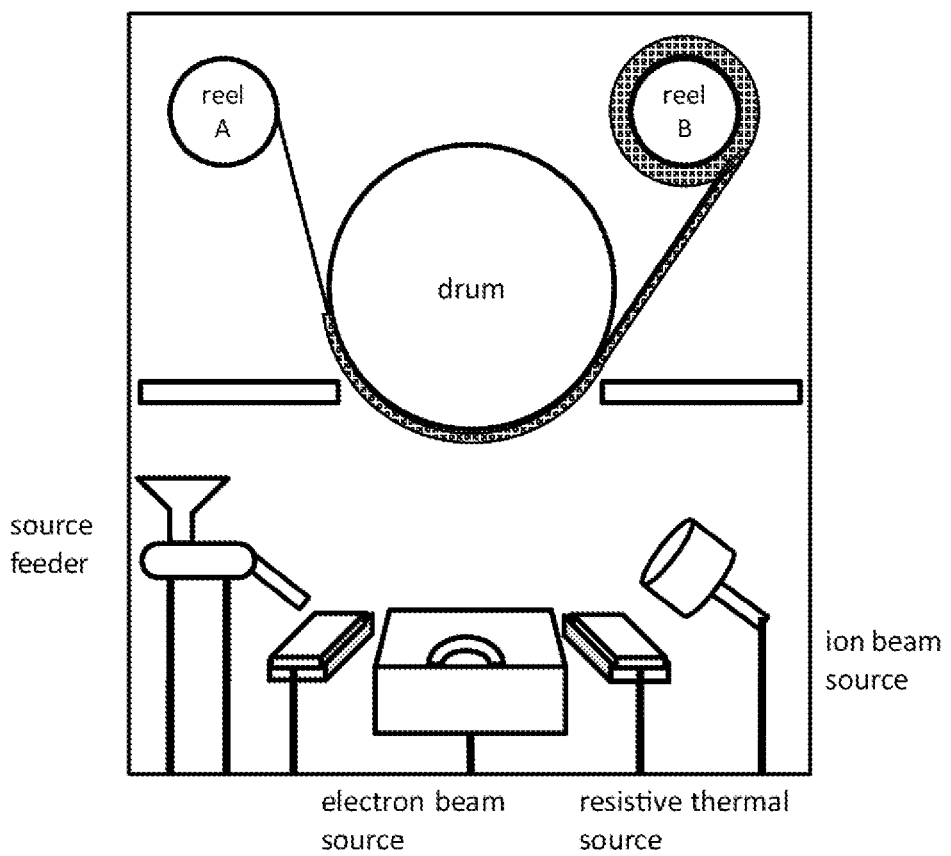
FIG. 3 is a simplified diagram of a processing apparatus according to an embodiment of the present invention.

FIG. 3 is a simplified schematic diagram illustrating an apparatus for depositing battery material onto a substrate according to an embodiment of the present invention.

In particular, the apparatus of FIG. 3 comprises a vacuum deposition chamber. The chamber is made of stainless steel, but can be others. The chamber is subjected to a vacuum of about $10^{-6}$ to about $10^{-4}$ Torr. The vacuum deposition chamber is configured to deposit thin films of materials making up an electrochemical cell. In particular, the vacuum deposition chamber is in fluid communication with a plurality of material sources allowing deposition of one or more of the following layers: a barrier, a cathode current collector, a cathode, an electrolyte, an anode, an anode current collector, and an interlayer barrier.

In a specific embodiment, the barrier can include an oxide of metal or metalloid, nitride of metal or metalloid, carbide of metal or metalloid, or phosphate of metal.

In a specific embodiment, the cathode material can include vanadium oxide, manganese oxide, iron oxide, nickel oxide, sulfur oxide, cobalt oxide, or magnesium oxide.

In a specific embodiment, the electrolyte material can include lithium oxide or lithium phosphide or lithium phosphate or lithium sulfate or lithium borate.

In a specific embodiment, the anode material can include lithium metal or a lithium alloy.

In a specific embodiment, the interlayer barrier material can include an oxide of metal or metalloid, nitride of metal or metalloid, carbide of metal or metalloid, or phosphate of metal.

In a specific embodiment, the current collectors can include nickel or copper or aluminum or other conductive metals.

Specifically, the vacuum deposition chamber is configured to have at least one evaporation source to deposit layers of battery materials onto a moving substrate. The vacuum deposition chamber also includes at least one ion beam source to provide reactive species to the active layers of battery cathode, electrolyte and anode materials. The deposition chamber is provided with at least one source feeder that deliver source materials to the evaporation sources during the flash deposition processes.

In a specific embodiment, the flash process is a film deposition process delivering the metered stream of evaporant to the hot wall of the reactor in a pattern whereas the balance between mass delivered and mass evaporated is constant, without causing residence times which would degrade the evaporant or coat the reactor surface.

Figure 4:
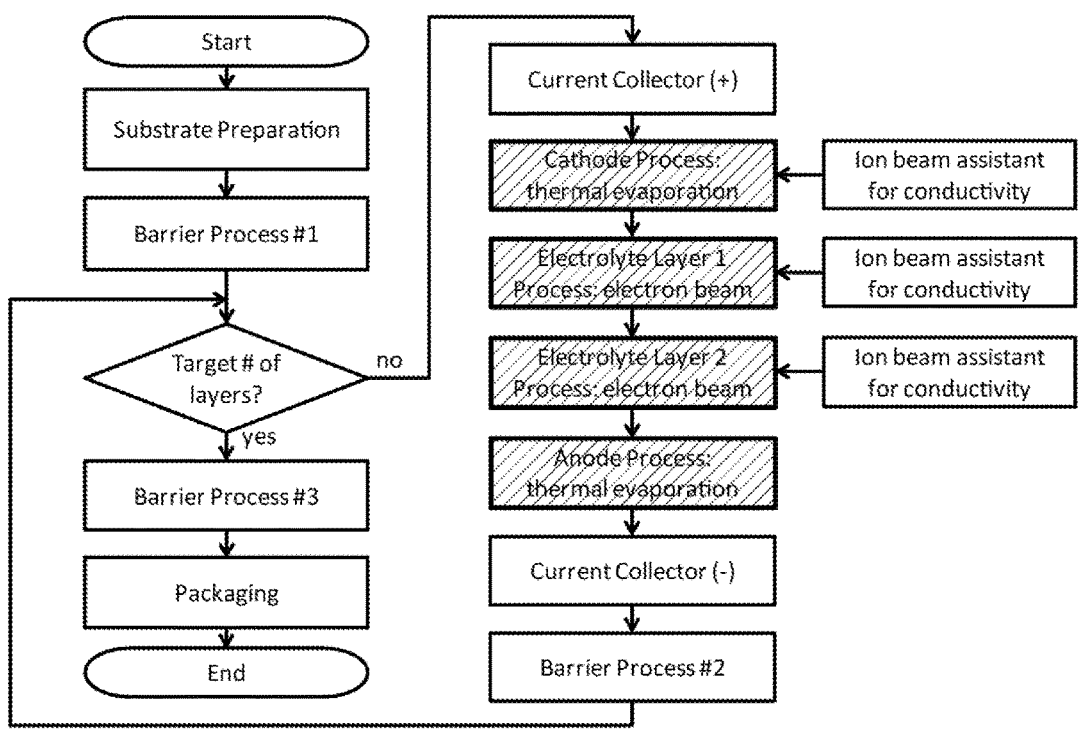
FIG. 4 is a simplified flow diagram of a process flow using a combination of energy evaporation source and ion beam doping according to an alternative embodiment of the present invention.

FIG. 4 is a simplified flow diagram showing the steps of a process flow of forming a battery structure utilizing the flash evaporation process described in this invention. Specifically, in a first step, the reels and drum are rotated to move a substrate in a first direction through the deposition chamber. In this step, the substrate is prepared for deposition with conditions including web tension and temperature.

In a second step, the barrier material is deposited on the substrate, which prevent any reaction between the substrate and battery materials during fabrication process and during the battery cycle life. This barrier also works as an insulating layer if the substrate is electrically conducting.

In a third step, the number of cell layers is compared to the target value based on the battery capacity, and the process steps for the next cell layer continue until the final cell layer is made.

In a fourth step, the current collector material for cathode or positive terminal is deposited. In a fifth step, the cathode material is deposited on the cathode current collector. Energy thermal source such as a hot wall reactor or an electron beam is used for the evaporation of metal oxide cathode material with an ion beam source providing dopant species into the thickness of metal oxide to increase conductivity of metal oxide material and cause an increase in ionic diffusivity of the thickness of the metal oxide material.

In a sixth step, the material of the electrolyte is deposited over the cathode with slow rate as a first layer of the bi-layer electrolyte structure. Energy thermal source such as a hot wall reactor or an electron beam is used for the evaporation of an oxide and a phosphide or a phosphate or a sulfate or borate with an ion source introducing an ionic species to the deposited film to increase ionic conductivity of the electrolyte. Then, in a seventh step, a second layer of electrolyte is continuously deposited with faster deposition rate to form a sufficient thickness of bi-layer electrolyte. The ion-to-atom ratio remains the same by controlling the ion beam source throughout the two electrolyte processes (sixth and seventh steps) for uniform material composition and chemical characteristics, such as conductivity.

In an eighth step, the anode material is deposited over the electrolyte. In a ninth step, the material of the anode current collector is deposited on the anode. In a tenth step, another barrier is deposited over the anode and anode current collector providing an insulation and separation between the anode and the next cell layer.

Then, the process flow goes back to the third step to compare the number of cells layers to the target value. The process continues to build multiple cell layers until the target number of cell layers is made, which triggers the next step. In an eleventh step, a final barrier will be deposited over the full number of cell layers to provide hermetic seal to the battery materials.

In a twelfth step, the battery films including multiple layers of barriers, current collectors, cathodes, electrolytes, and anodes are packaged for mechanical support and electrical connection.

The above sequence of steps provides a process according to an embodiment of the present invention. As shown, the method uses a combination of steps including changes in deposition energy sources and ion beam sources with various gas species. Each process step, or a group of steps in the present invention can be done in a separate vacuum chamber equipped with specific combinations of processing tools. The substrate is to pass the series of chambers to completion. The sequence can also be realized by using a single vacuum chamber with changes in the direction of the substrate through the chamber, coupled with changes in deposition conditions within the chamber.

Example 1—Ion Beam Assisted Flash Evaporation Process for High Conductivity Vanadium Oxide Cathode by Nitrogen Doping This example demonstrates the process of manufacturing a cathode battery material with improved conductivity for high performing electrochemical cells by using ion beam source to provide dopant species. In particular, a vanadium oxide is the cathode material deposited on a polymer substrate in roll-to-roll configuration, and nitrogen is a dopant for conductivity enhancement.

Deposition system as described in FIG. 3 is used for the process, with all the energy sources, ion beam source, and source feeder contained in one vacuum chamber. Vanadium oxide source material is loaded in the feeder prior to the vacuum process, and fed continuously into the evaporation source with a controlled rate throughout the deposition process. When the cathode source is provided on a hot wall reactor region where the hot wall reactor region is characterized by a temperature ranging from about 600 to 1200° C., the vanadium oxide material evaporates immediately on contact.

The ion beam source is provided with nitrogen and argon gasses to form nitrogen and argon plasma where nitrogen is a reactive species and argon is an energy carrier. The ion beam is provided at energy from about 100 to about 400 electron volts, causes the nitrogen species to react with the evaporated vanadium oxide at the condensation region on the substrate. The process can be controlled by several variables including ion beam energy, ion beam gas ratio, and ion-to-atom ratio to determine the resulting cathode properties.

Figure 5:
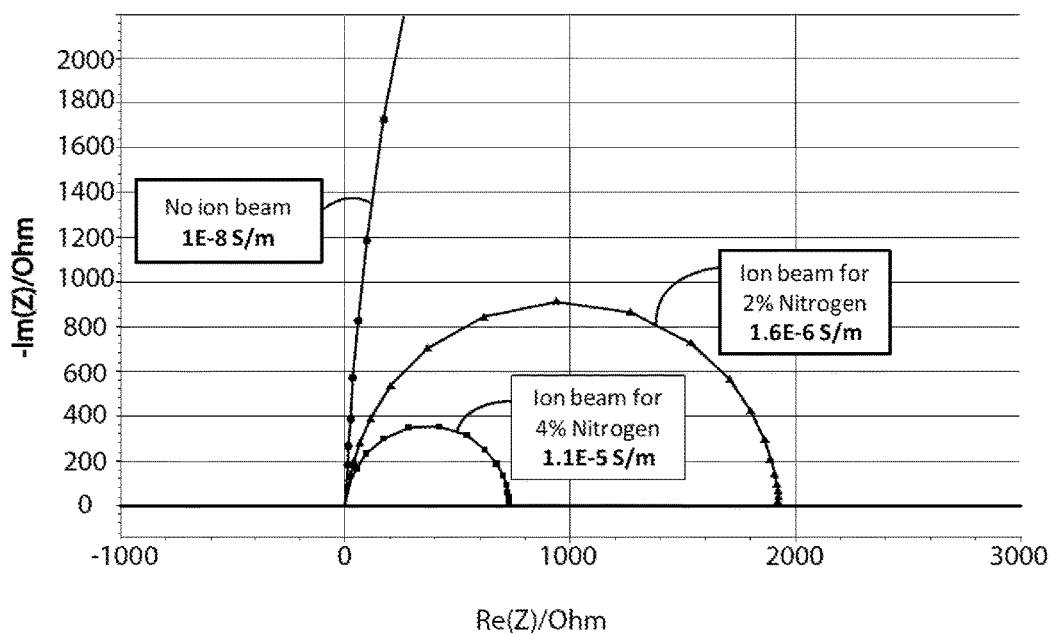
FIG. 5 is an illustration of experimental results of electrochemical impedance spectroscopy (EIS) to measure cathode electronic conductivity according to examples of embodiments of the present invention.

FIG. 5 presents experimental data on the cathode conductivity from different ion beam process conditions. Three EIS measurements are shown in this graph; one from a cathode sample made with no additional ion beam during deposition, one from a cathode with ion beam assisted deposition to incorporate 2% nitrogen, and another from a cathode with ion beam assisted deposition with higher beam power to incorporate 4% nitrogen. By increasing the nitrogen doping in the thickness of cathode film, we can enhance its electrical conductivity from $10^{-8}$ Siemens/meter to about $10^{-5}$ Siemens/meter.

Example 2—Ion Beam Assisted Flash Evaporation Process for High Conductive Lithium Phosphorous Oxynitride Electrolyte with Bi-Layer Structure by Nitrogen and Oxygen Doping In this example, electrolyte process is demonstrated for high ionic conductivity by using a ion beam source with two active gas species. The electrolyte source material is lithium phosphate, and the ion beam species are nitrogen and oxygen. The source material is fed to the electron beam evaporation source continuously by the source feeder to maintain a pool of melt lithium phosphate source under the sweep of electron beam.

A key to a high yield electrolyte process is making a bi-layer structure where the first layer is thin between 50 and 2000 Angstroms at a rate of less than about 10 Angstroms per second and an overlying second thickness of about 1000 to about 10,000 Angstroms at a rate greater than about 10 Angstroms per second.

Ion beam is provided with nitrogen and oxygen gasses, and provide ionized nitrogen and oxygen to the condensing film to form lithium phosphorous oxynitride electrolyte on the substrate. The ion beam is provided at energy from about 100 to about 400 electron volts. The ion beam energy, nitrogen-to-oxygen ratio, and ion-to-atom ratio cause the compositional changes in the electrolyte and determine its conductivity.

Figure 6:
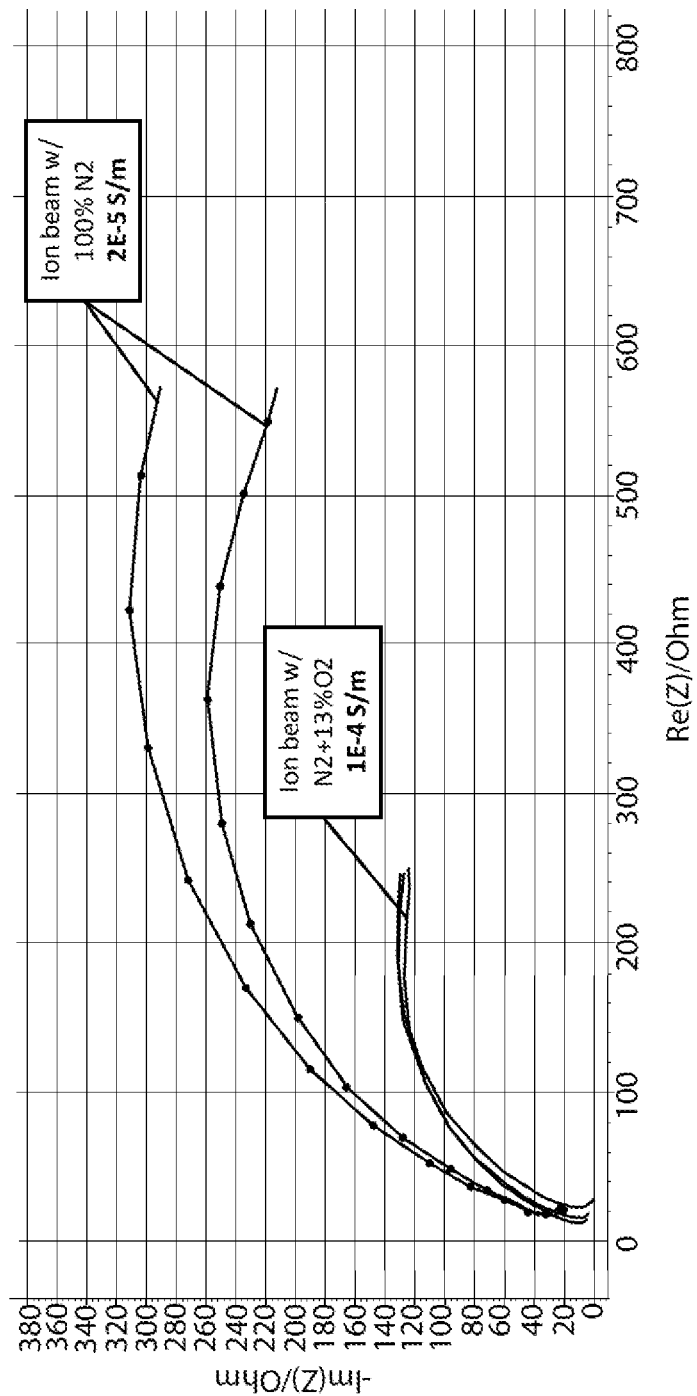
FIG. 6 is a illustration of experimental results of electrochemical impedance spectroscopy (EIS) to measure electrolyte ionic conductivity according to examples of embodiments of the present invention.

FIG. 6 illustrates experimental data on the electrolyte conductivity from different ion beam process conditions. One sample group is provided with 100% nitrogen to the ion beam source, while the other group is processed with partial oxygen content in the ion beam during deposition. The ionic conductivity of lithium phosphorous oxynitride has improved from $2\times10^{-5}$ Siemens/meter to $1\times10^{-4}$ Siemens/meter with the additional oxygen in the ion beam process.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for manufacturing a cathode for a solid-state battery device using a flash process comprising:
   providing a substrate on a transfer device;
   continuously feeding a metal oxide cathode source material to an evaporation source, wherein the evaporation source is located under the substrate;
   subjecting the metal oxide cathode source material to thermal energy to cause a portion of the source to evaporate into a vapor phase free from undesirable metal oxide species;
   forming a metal oxide material layer overlying the substrate by condensing the vapor phase as the substrate moves either in a first direction or a second direction;
   subjecting the metal oxide material layer to an ion source while the thickness of metal oxide material layer is being formed to incorporate a nitrogen content of the metal oxide material layer of 2% to 4% to achieve an electrical conductivity of the metal oxide material layer of $10^{-6}$ to $10^{-5}$ S/m; and maintaining the substrate in a vacuum environment during the formation of the metal oxide material layer.

2. The method of claim 1, wherein the forming of the metal oxide material layer occurs at a rate of about 100 to 10,000 Angstroms per second per 100 square centimeters; wherein the ion source is an ion beam or an ion shower.

3. The method of claim 1, wherein the substrate moves at a rate of about 1 inches/min to about 10 feet/min.

4. The method of claim 1, wherein cathode source comprises vanadium oxide.

5. The method of claim 1, wherein the metal oxide cathode source comprises vanadium oxide, manganese oxide, iron oxide, nickel oxide, sulphur oxide, cobalt oxide, or magnesium oxide.

6. The method of claim 1, wherein subjecting the metal oxide layer comprises introducing a dopant species into the metal oxide material layer to cause an increase in conductivity of the metal oxide material layer and cause an increase in ionic diffusivity of the metal oxide material layer.

7. The method of claim 1, further comprising introducing a dopant species into the metal oxide material layer, the dopant comprising nitrogen, oxygen, carbon, fluorine, silver, molybdenum, copper, tin, aluminium, iodine, phosphorous, or silicon.

8. The method of claim 1, wherein the thermal energy is provided by an e-gun, a sputtering process or on a hot wall reactor region; wherein the hot wall reactor region is characterized by a temperature ranging from about 600 to 1200 Degrees Centigrade; wherein the metal oxide cathode material is vanadium oxide; wherein the ion source is provided at an energy from about 100 to about 400 electron volts.

9. The method of claim 8, wherein the thermal energy is provided by a region of a hot wall reactor and further comprising a shaped mask device configured between the region of the hot wall reactor and the substrate, the shaped mask device configured to be coupled to a heating device to maintain the shaped mask device essentially free from a residue from the metal oxide cathode source and positioned to allow either demarcation of the cathode source r oblique angle deposition for the formation of voids or a porous cathode or cathode modification layer.

10. The method of claim 1, wherein the transfer device comprises a first drum coupled to a second drum and configured in a reel to reel.

11. The method of claim 1, wherein the substrate is configured for single or multiple passes of the substrate in the vacuum environment.

12. The method of claim 1, wherein the cathode source is one of a plurality of sources within the vacuum environment.

13. The method of claim 1, wherein the metal oxide material layer comprises a mixture of cathode and anode material co-deposited to form a cathode layer in a partially or fully discharged state with modified intercalation stresses.

14. The method of claim 1, wherein the vapor phase comprises entrained non-reactive species in the shape of nano rods, cones, columns, fibers, or spheres, with or without a binder, to form voids or a voided porous cathode or cathode modification layer.

15. The method of claim 1, wherein the energy source comprises a plurality of respective energy sources which are configured to be combined.

\* \* \* \* \*